(12) United States Patent
Tanaka et al.

(10) Patent No.: US 7,477,251 B2
(45) Date of Patent: Jan. 13, 2009

(54) SYSTEM FOR ACQUIRING PROFILE INFORMATION FROM THREE-DIMENSIONAL PROFILE DATA, ITS METHOD AND COMPUTER SOFTWARE PROGRAM

(75) Inventors: Koji Tanaka, Tokyo (JP); Tsuyoshi Harada, Tokyo (JP)

(73) Assignee: Lattice Technology, Inc., Tokyo (JP)

( * ) Notice: Subject to any disclaimer, the term of this patent is extended or adjusted under 35 U.S.C. 154(b) by 76 days.

(21) Appl. No.: 10/539,949

(22) PCT Filed: Oct. 29, 2003

(86) PCT No.: PCT/JP03/13861

§ 371 (c)(1), (2), (4) Date: Jun. 17, 2005

(87) PCT Pub. No.: WO2005/041075

PCT Pub. Date: May 6, 2005

(65) Prior Publication Data

US 2006/0170672 A1    Aug. 3, 2006

(51) Int. Cl.
*G06T 17/00* (2006.01)
(52) U.S. Cl. .................. 345/420; 345/419; 700/98; 703/2; 250/349; 250/370.08
(58) Field of Classification Search .............. 345/419, 345/420, 440; 700/98; 703/2
See application file for complete search history.

(56) References Cited

U.S. PATENT DOCUMENTS

| | | | |
|---|---|---|---|
| 5,815,154 A | 9/1998 | Hirschtick et al. | |
| 6,219,049 B1 | 4/2001 | Zuffante et al. | |
| 6,741,242 B1 * | 5/2004 | Itoh et al. | 345/419 |
| 6,867,769 B1 | 3/2005 | Toriya et al. | |
| 7,065,476 B2 * | 6/2006 | Dessureault et al. | 703/2 |
| 7,079,907 B2 * | 7/2006 | Kimura et al. | 700/98 |
| 2002/0042705 A1 | 4/2002 | Nakajima et al. | |
| 2004/0199434 A1 | 10/2004 | Tanaka et al. | |
| 2005/0168460 A1 * | 8/2005 | Razdan et al. | 345/419 |

FOREIGN PATENT DOCUMENTS

| | | |
|---|---|---|
| EP | 1197920 | 4/2002 |
| EP | 1443430 | 8/2004 |
| JP | 11-306220 | 11/1999 |
| JP | 2000-057379 | 2/2000 |
| JP | 2003-030256 | 1/2003 |
| WO | 97/022952 | 6/1997 |
| WO | 03/038688 | 5/2003 |

OTHER PUBLICATIONS

European Patent Office, "Supplementary European Search Report", Application No. EP03769970, Feb. 14, 2008, 3 pages.

* cited by examiner

*Primary Examiner*—Kimbinh T Nguyen
(74) *Attorney, Agent, or Firm*—Dann, Dorfman, Herrell & Skillman, PC (57) ABSTRACT

In order to circumvent the problems above, the present invention aims to expand the scope of the usage of the information included in three-dimensional shape data by acquiring the shape information included in the three-dimensional shape data automatically on a shape element basis and setting linkages across the acquired information.

Linked processing can be performed across the corresponding shape information having different shape elements by adding a linkage identifier to the shape information when generating the shape information from the three-dimensional shape data. For example, when processing for a single shape information is carried out, other shape information can be edited by linkage.

17 Claims, 10 Drawing Sheets

Physical structure

FIG. 4

Logical structure

FIG. 5

"printer"
FIG. 6A

"base"
FIG. 6B

"cover"
FIG. 6C

"panel"
FIG. 6D

"tray"
FIG. 6E

A set of image data acquired

| Linkage Identifier | Attribute A (Name) | Attribute B (No.) | Attribute C (Weight) |
|---|---|---|---|
| printer | Printer | 1 | 10.0 |
| base | Base | 2 | 4.0 |
| cover | Cover | 3 | 4.0 |
| panel | Panel | 4 | 0.5 |
| tray | Tray | 5 | 1.5 |

Attribute table acquired from the groups

| Linkage identifier | Attribute 1 (Names) | Attribute 2 (Notes) |
|---|---|---|
| layer1 | Part 1 | A set of printer lower parts |
| layer2 | Part 2 | A set of printer upper parts |

| Identifier 1 |
|---|
| Attribute value A |
| Attribute value B |
| : |
| Identifier 2 |
| Attribute value A |
| Attribute value B |
| : |
| Identifier 3 |
| : |

| Identifier1 |
|---|
| Two-dimensional vector data 1 |
| Identifier2 |
| Two-dimensional vector data 2 |
| Identifier3 |
| : |

| Identifier1 |
|---|
| Image data 1 |

| Identifier2 |
|---|
| Image data 2 |

| Identifier3 |
|---|
| : |

SYSTEM FOR ACQUIRING PROFILE INFORMATION FROM THREE-DIMENSIONAL PROFILE DATA, ITS METHOD AND COMPUTER SOFTWARE PROGRAM

FIELD OF THE INVENTION

This invention relates to a method for processing three-dimensional shape data, and more particularly, it relates to a method for carrying out linked processing across shape information acquired automatically from three-dimensional shape data.

BACKGROUND OF THE INVENTION

Recently, more and more three-dimensional shape data prepared on computers using CAD and the like are processed to acquire and process information regarding various shapes (hereinafter referred to as "shape information") to be used as engineering data. That is, from the three-dimensional shape data expressed on computers, attributes that are set in the elements included in the shapes and the two-dimensional vector data and image data that are displayed on the display devices can be acquired as shape information.

However, the users must acquire the shape information individually and if linkages are necessary across the shape information, the users must process them by directly editing while considering the contents of the shape information, which limits the users from efficiently using the shape information included in the three-dimensional shape data.

In order to circumvent the problems above, the purpose of the present invention is to expand the scope of the usage of the shape information included in the three-dimensional shape data, by acquiring the shape information included in the three-dimensional shape data automatically on a shape element basis and forming links between the acquired shape information.

SUMMARY OF THE INVENTION

According to a first aspect of the present invention, there is provided a system for acquiring shape information from three-dimensional shape data using a computer system, the three-dimensional shape data including at least one shape element, having a three-dimensional shape data acquisition unit for acquiring the three-dimensional shape data stored in a data storage unit; a three-dimensional shape information generation unit for generating, on the shape element basis, various types of shape information related to each shape element; a linkage identifier setup unit for adding linkage identifiers to link, for each shape element, among the various types of shape information for that element, when generating the shape information; a shape information storing unit for storing the shape information having the linkage identifiers in the data storage unit; and a shape information linkage control unit for, while referring to the linkage identifiers, linking and processing among the various types of shape information related to a particular shape element. It is desirable that the three-dimensional shape information generation unit successively acquires, based on the physical and logical organizations of the three-dimensional shape data, each type of shape information related to the shape elements making up such physical and logical organizations.

According to the above configuration, when generating shape information from the three-dimensional shape data, a linked processing can be performed across the corresponding shape information having different shape elements by adding a linkage identifier to the shape information. For example, when a processing for single shape information is carried out, other shape information can be edited by linkage.

According to one embodiment of the present invention, the three-dimensional shape information generation unit acquires information regarding the shape element's name, attributes, two-dimensional vector data, and image data as the shape information on a shape element basis.

According to another embodiment of the present invention, the linkage identifier setup unit generates linkage identifiers based on the information concerning the shape elements included in the three-dimensional shape data.

According to yet another embodiment of the present invention, the shape information linkage control unit has a plurality of information processing modules for displaying the shape information, and a linkage control module connected to the plurality of information processing modules, wherein upon the indication of a specific shape element related to the shape information displayed by the information processing modules, the linkage identifier corresponding to that shape element is sent to the linkage control module, and in turn, the linkage control module sends the identifier to each information processing module so that each information processing module changes, by a specified method, its display for the shape elements that correspond to the identifier.

According to a second aspect of the present invention, there is provided a system for acquiring shape information from three-dimensional shape data using a computer system, the three-dimensional shape data including at least one shape element, and linking and processing among the various types of shape information related to the shape elements; having a three-dimensional shape data acquisition unit for acquiring the three-dimensional shape data stored in a data storage unit; a three-dimensional shape information generation unit for generating, on the shape element basis, various types of shape information related to the shape elements; a linkage identifier setup unit for adding linkage identifiers to link, for each shape element, among the various types of shape information for each element, when generating the shape information; and a shape information storing unit for storing the shape information having the linkage identifiers in the data storage unit.

According to a third aspect of the present invention, there is provided a computer software program for acquiring shape information from three-dimensional shape data using a computer system, the three-dimensional shape data including at least one shape element, having a three-dimensional shape data acquisition command unit, stored in a computer readable storage medium, for acquiring three-dimensional shape data stored in a data storage unit; a three-dimensional shape information generation command unit, stored in the computer-readable storage medium, for generating on the shape element basis, various types of shape information related to the shape elements; a linkage identifier setup command unit, stored in the computer-readable storage medium, for adding linkage identifiers to link, for each element, among the various types of shape information for that element, when generating the shape information; a shape information storing command unit, stored in the computer-readable storage medium, for storing the shape information having the linkage identifiers in the data storage unit; and a shape information linkage control command unit, stored in the computer-readable storage medium, for linking and processing among the various types of shape information related to the particular shape elements, while referring to the linkage identifiers.

The other characteristics of the present invention and marked effects can be clearly understood by those skilled in the art by referring to the subsequent detailed description of the preferred embodiments and drawings of the present invention.

DETAILED DESCRIPTION OF THE PREFERRED EMBODIMENTS

One embodiment of the present invention is described below with reference to the accompanying drawings to facilitate understanding of the present invention.

Figure 1:
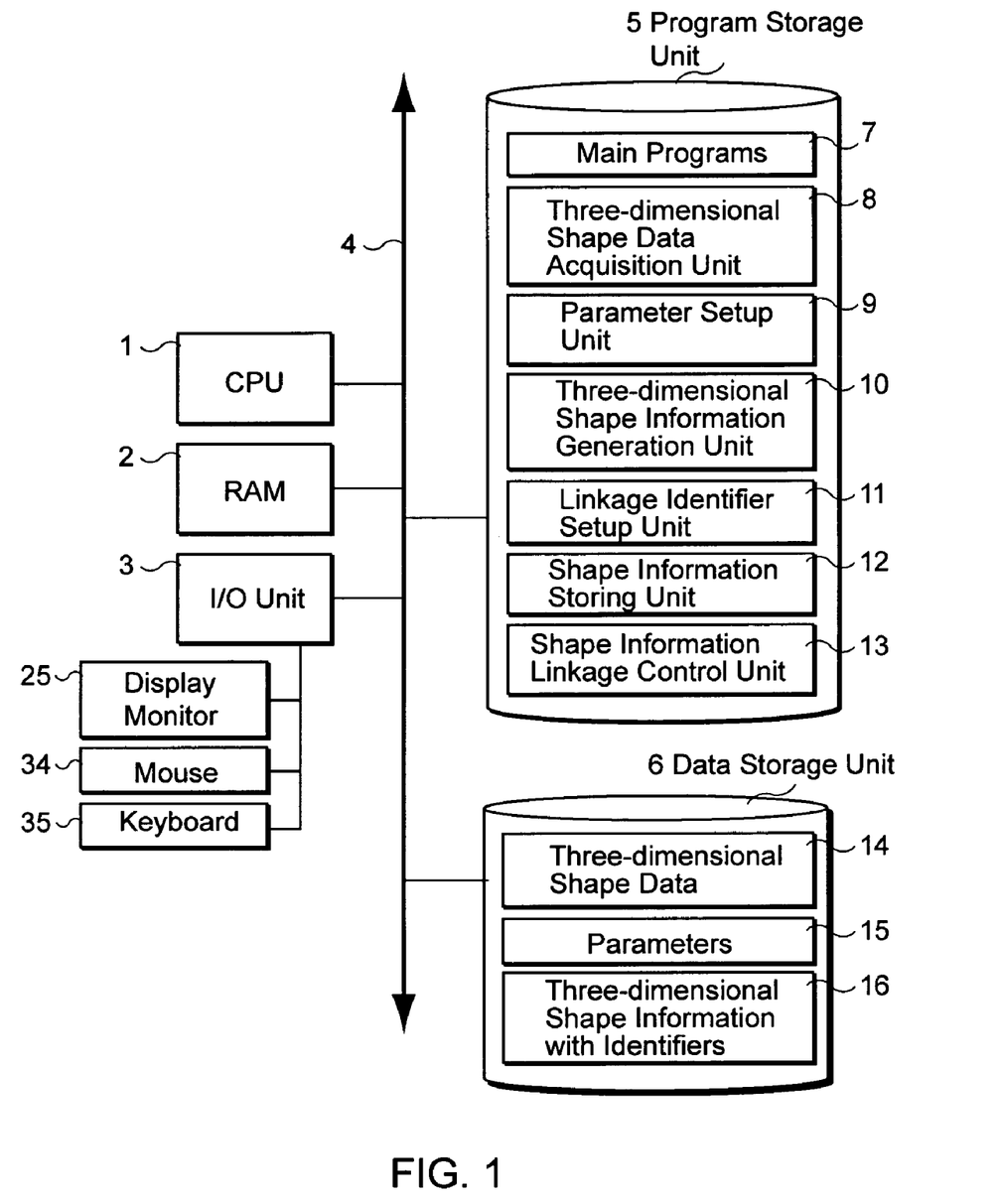
FIG. 1 is an overview showing a system configuration according to one embodiment of the present invention.

FIG. 1 is a schematic diagram showing a three-dimensional data processing system of the present embodiment. In this system, a program storage unit 5 and a data storage unit 6 are connected to a bus 4 to which a CPU 1, a RAM 2, and input/output interface 3 are connected. Beside the main programs (programs required for basic operations such as OS, etc.), this program storage unit 5 contains a three-dimensional shape data acquisition unit 8 for acquiring three-dimensional shape data from the data storage unit 6; a parameter setup unit 9 for setting up parameters, received from a user etc., for fetching various shape information from three-dimensional shape data; a three-dimensional shape information generation unit 10 for generating various shape information from the three-dimensional shape data based on the parameters; a linkage identifier setup unit 11 for setting up a respective linkage identifier when fetching each shape information on a shape element basis; a shape information storing unit 12 for storing the shape information having the linkage identifier in the data storage unit 6; and a shape information linkage control unit 13 for processing various shape information by way of linking by referring to linkage identifiers.

These components 5 to 13 are actually comprised of storage media such as a hard disk connected to the computer system and a group of software programs (Command group) that are installed therein, which function as components of the present invention when they are called as needed by the CPU1 into the memory such as the RAM 2 to be executed. The above components 9 to 13 are stored and distributed in a portable storage media such as a CD-ROM as computer software programs of the present invention, which constitute a system of the present invention when installed accordingly in the computer system.

Figure 2:
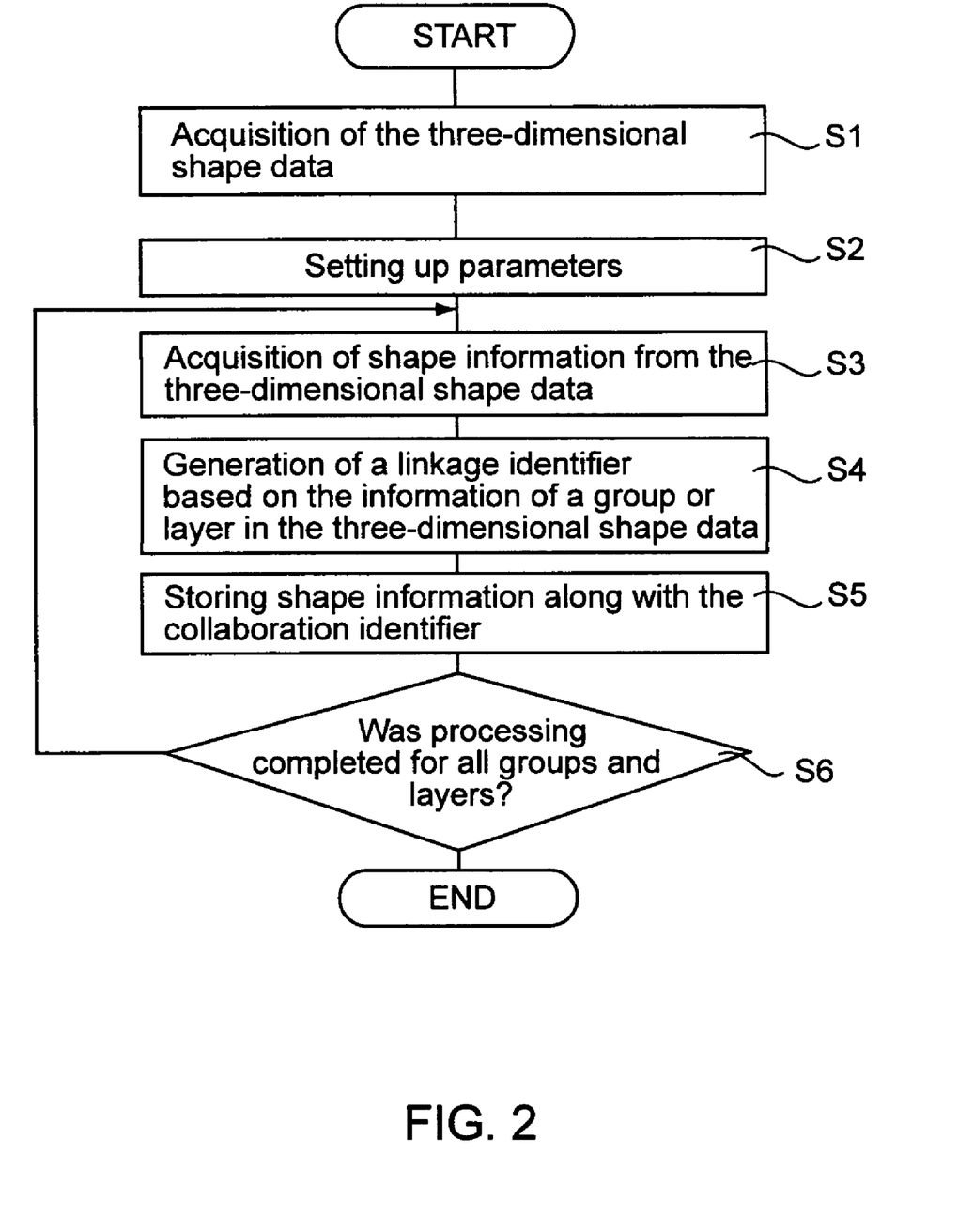
FIG. 2 is a flowchart showing the operations of the embodiment.

The above components will be described in detail below with their operations. FIG. 2 is a flowchart showing the operations of these components. In the following explanation, reference symbols S1 to S6 shown in FIG. 2 correspond to Steps S1 to S6 respectively as references to various processes during the operations.

Initially, the three-dimensional shape data acquisition unit 8 acquires three-dimensional shape data 14 from the data storage unit 6, and deploys the three-dimensional shape data 14 on the RAM 2 in such a state that shape related data can be acquired (Step S1). In this embodiment, the three-dimensional shape data 14 are in the XVL (registered trademark) format, comprising the following elements.

(1) "Shell"
"Shell" is a unit expressing the actual object of a shape, comprising geometric and topological information.

(2) Group
"Group" is a physical unit expressing the structure of a shape, and an entirety of all groups within the shape data, is expressed by groups having hierarchical structures. A group includes names of parts, positional information and attribute information, and an end group in a hierarchical structure contains shells.

(3) "Layer"
"Layer" is a unit that logically sums up the elements included in a shape. A layer is expressed by a plurality of groups. A layer includes the name of the layer, and attribute information, and is defined independently from the physical structure expressing the actual object of the shape according to the purposes of utilization.

(4) "Attribute"
"Attribute" is arbitrary information that is set up for groups and layers. The contents are numerical values and character strings. Management methods for attributes include a method in which they are set directly for groups and layers in three-dimensional shape data, and a method in which they are managed externally outside the three-dimensional shape data 14 using names of groups and layers as keys.

Figure 3:
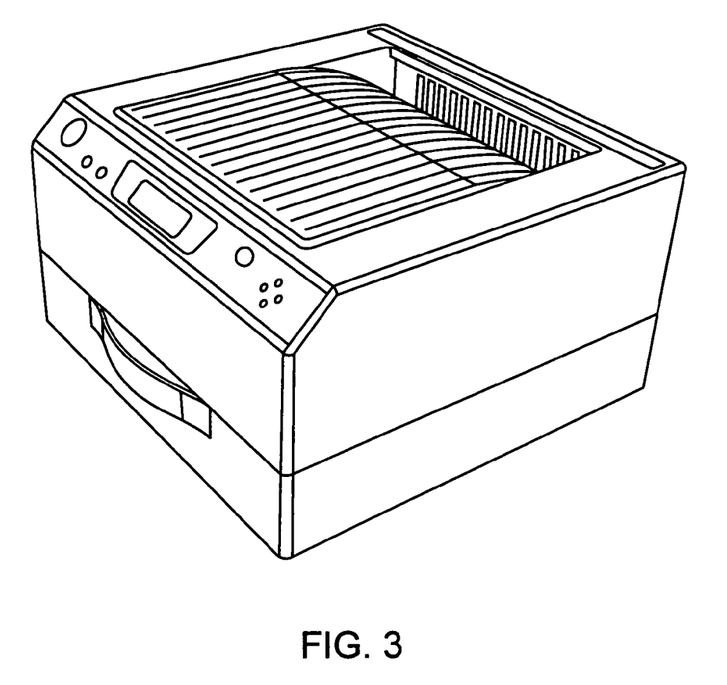
FIG. 3 is an example of three-dimensional image data of the same embodiment.
Figure 4:
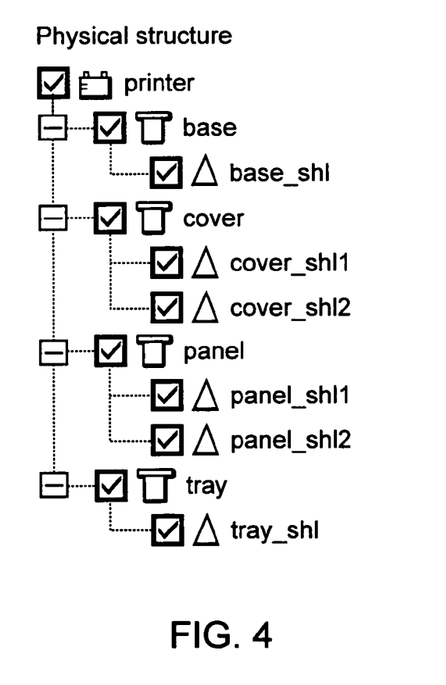
FIG. 4 is a schematic diagram showing a physical structure of the three-dimensional image data of the same embodiment.
Figure 5:
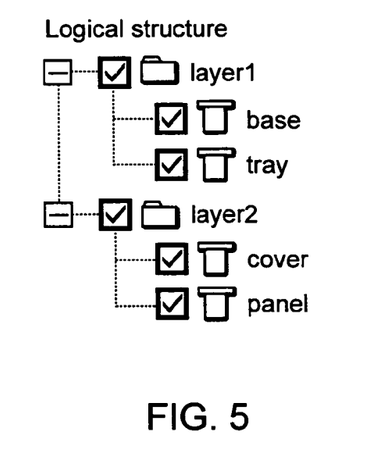
FIG. 5 is a schematic diagram showing a logical structure of the three-dimensional image data of the same embodiment.
Figure 6A:
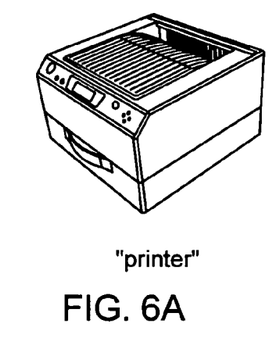
FIG. 6 is a diagram showing image data corresponding to each group of the same embodiment.
Figure 6B:
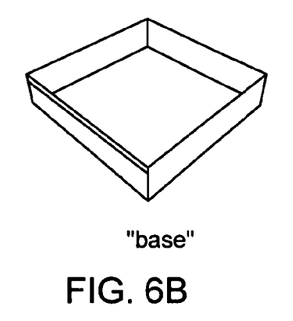
Figure 6C:
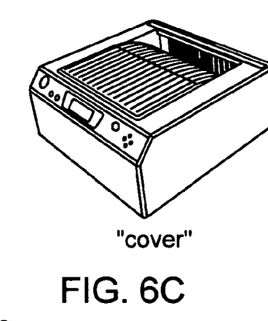
Figure 6D:
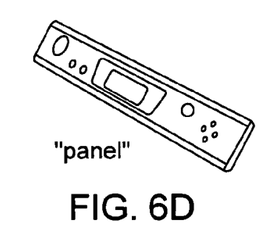
Figure 6E:
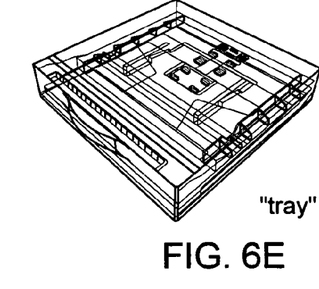

FIG. 3 shows an example of three-dimensional shape data 14, FIG. 4 is its physical structure, and FIG. 5 is its logical structure.

The elements having "base_shl" and "panel_shll" in the physical structure correspond to shells and the elements having "printer" and "cover" correspond to groups. In addition, the elements having "layer 1" and "layer 2" in the logical structure correspond to layers and the elements having "base" and "tray" correspond to groups included in the layers.

Subsequently, users input necessary parameters 15 when acquiring shape related data from the three-dimensional shape data 14 using input devices such as a keyboard and mouse that are connected to the input/output interface (Step S2). The parameters 15 that are specified include view point information and texture information required when acquiring two-dimensional vector data and image data. If no such parameters are input by users, defaults or predefined specific parameters can be used.

Subsequently, the three-dimensional shape information generation unit 10 acquires various information by group or layer (shape element) included in the three-dimensional data 14 based on the parameters 15 (Step S3). At this point, the linkage identifier setup unit 11 sets up a linkage identifier for linking the shapes corresponding to respective groups or layers (Step S4).

How the shape information and linkage identifier are generated will be described in detail below. Initially, shape information is acquired per group or layer included in the three-dimensional shape data, and then a respective linkage identifier is allocated.

FIGS. 6A-E are image data corresponding to various groups. These image data are obtained by projecting on a two-dimensional plane surface a group of shells included in a group, or a group of shells included in the groups of a layer. In this example, linkage identifiers: "printer", "base", "cover", "panel" and "tray" are allocated to the respective groups.

Figure 7:
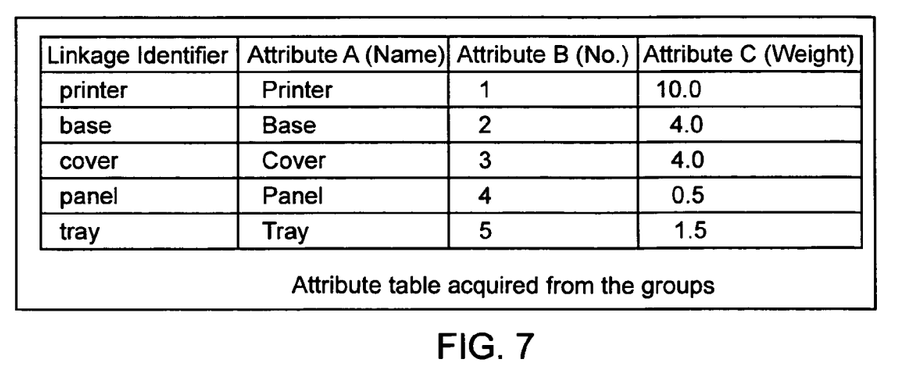
FIG. 7 is a diagram showing a table indicating attributes of the same embodiment.

FIG. 7 is a table showing attributes. This attribute table summarizes information of the numerical values or character strings established in groups and layers, and the same linkage identifiers as those added to the image data are added to the same groups and layers. The attributes are information that can be freely set for the elements included in the three-dimensional shape data, and "title" "number" and "weight" are examples.

Figure 8:
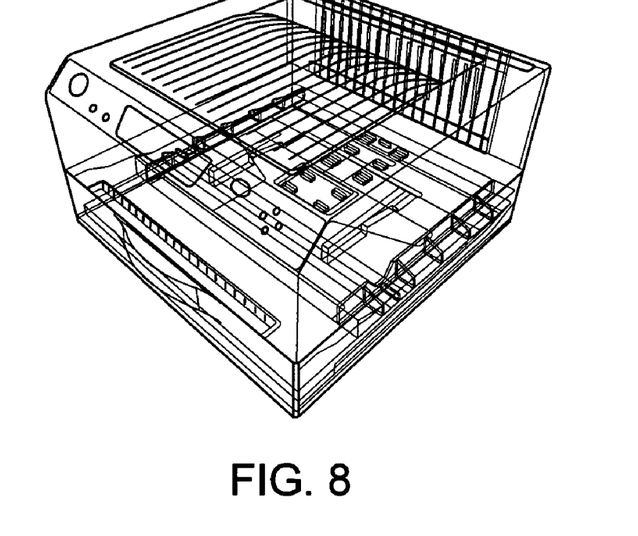
FIG. 8 is a diagram showing two-dimensional vector data generated of the same embodiment.

FIG. 8 shows two-dimensional vector data generated. The two-dimensional vector data are obtained by projecting a group of shells included in a group or a group of shells included in the groups of a layer on a two-dimensional plane surface. As for this two-dimensional vector data, it is also acquired by the assignment of the same linkage identifiers as those used above for respective corresponding groups and layers.

In this embodiment, the linkage identifier setup unit 11 automatically generates these linkage identifiers from the respective groups (part names). Furthermore, the generation method of the shape information, to which these linkage identifiers are established, is not in question. One can consider information such as those converted to character strings from attribute values or data expressed within the computer, or information generated by using a method such as the "Z buffer method", in the case of image data or 2D vector data.

Subsequently, the data storage unit 6 stores the shape information 16 that is acquired by the shape information storing unit 12. The shape information 16 acquired is stored along with the original three-dimensional shape data 14 (Step S5).

The above steps S3 to S6 are repeated by the number of groups and layers included in the three-dimensional shape data (Step S6).

Figure 9:
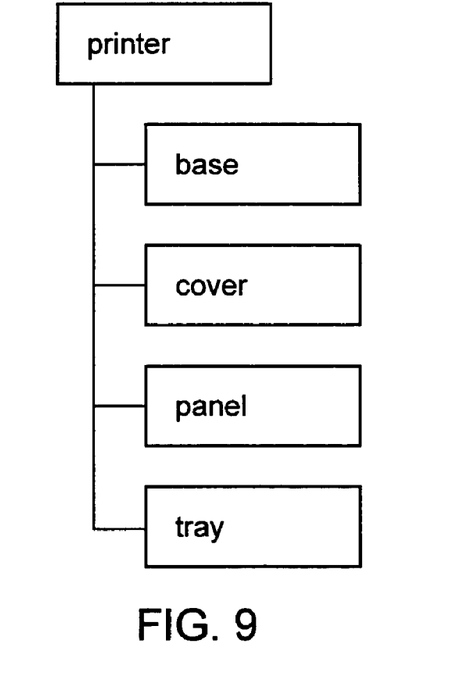
FIG. 9 is a diagram showing a list of shape-related data of the same embodiment.
Figure 10:
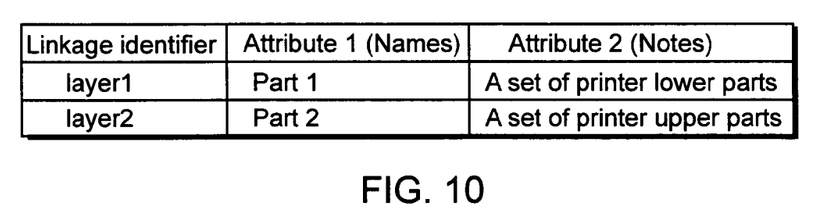
FIG. 10 is an attribute table acquired from the layers of the same embodiment.
Figure 11:
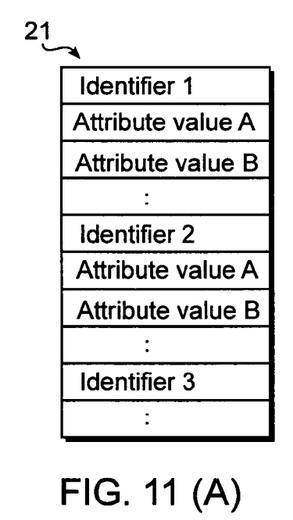
FIG. 11 is a schematic diagram showing the internal structures of the attribute table, two-dimensional vector data, and image data of the same embodiment, to which linkage identifiers are assigned.

FIG. 9 shows a list of the shape related data acquired by the above processing. FIG. 10 shows an attribute table acquired from layers, and FIG. 11 shows an internal structure of the shape related information acquired. FIG. 11 shows the shape information generated above, that is, it shows the relationship among the attribute table, two-dimensional vector data and two-dimensional image data. The corresponding groups are controlled by the same linkage identifiers (identifiers 1, 2, 3 . . . ).

Figure 12:
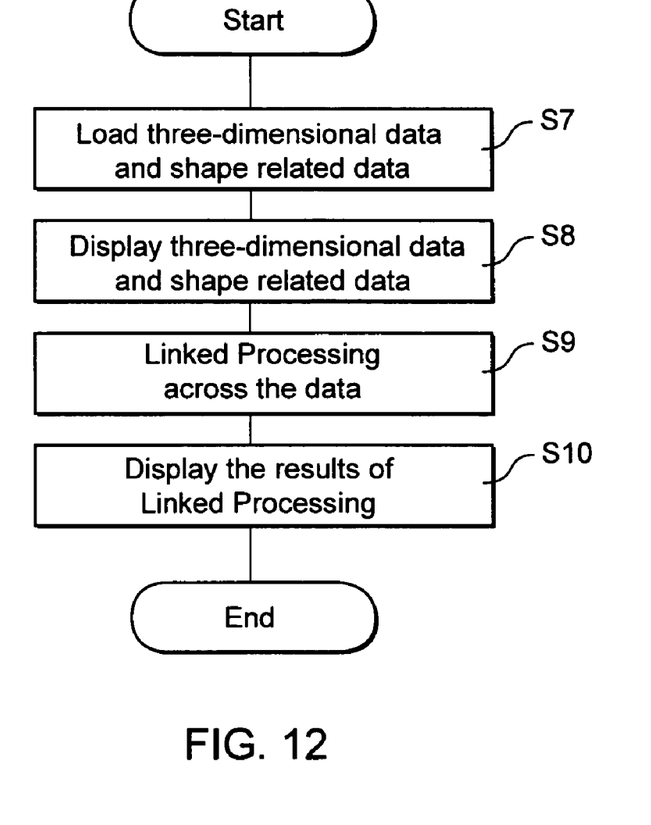
FIG. 12 is a flowchart showing a linkage processing for the same embodiment.

Subsequently, processing procedures for the shape information linkage control unit 13 will be explained below when linked processing is carried out across the shape information acquired as explained above. FIG. 12 is a flowchart of that.

Initially, the linkage control unit 13 acquires three-dimensional shape data and shape related information from the data storage unit 6 to load them into the memory (linkage control unit 13) (Step S7).

Figure 13:
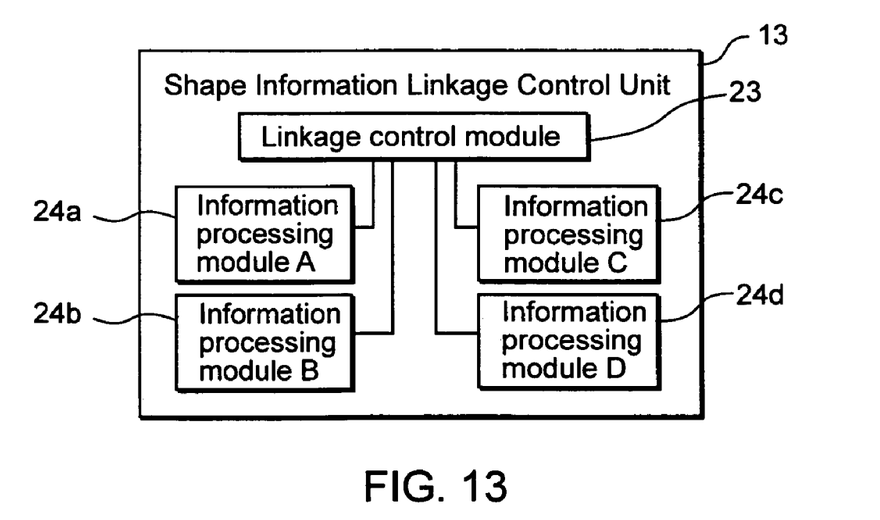
FIG. 13 is an outline diagram showing the configuration of the shape information linkage control unit.

FIG. 13 is a schematic diagram showing the structure of this linkage control unit 13. This linkage control unit 13 comprises a linkage control module 23 and information processing modules A (24a) to D (24d) connected to the linkage control module 23, as shown in this figure. Initially, the shape information read is given to one of the information processing modules A to D depending upon its type, and the contents are output by the information processing module via input/output unit 3 so that they can be displayed on the display monitor 25 (Step S8).

Figure 14:
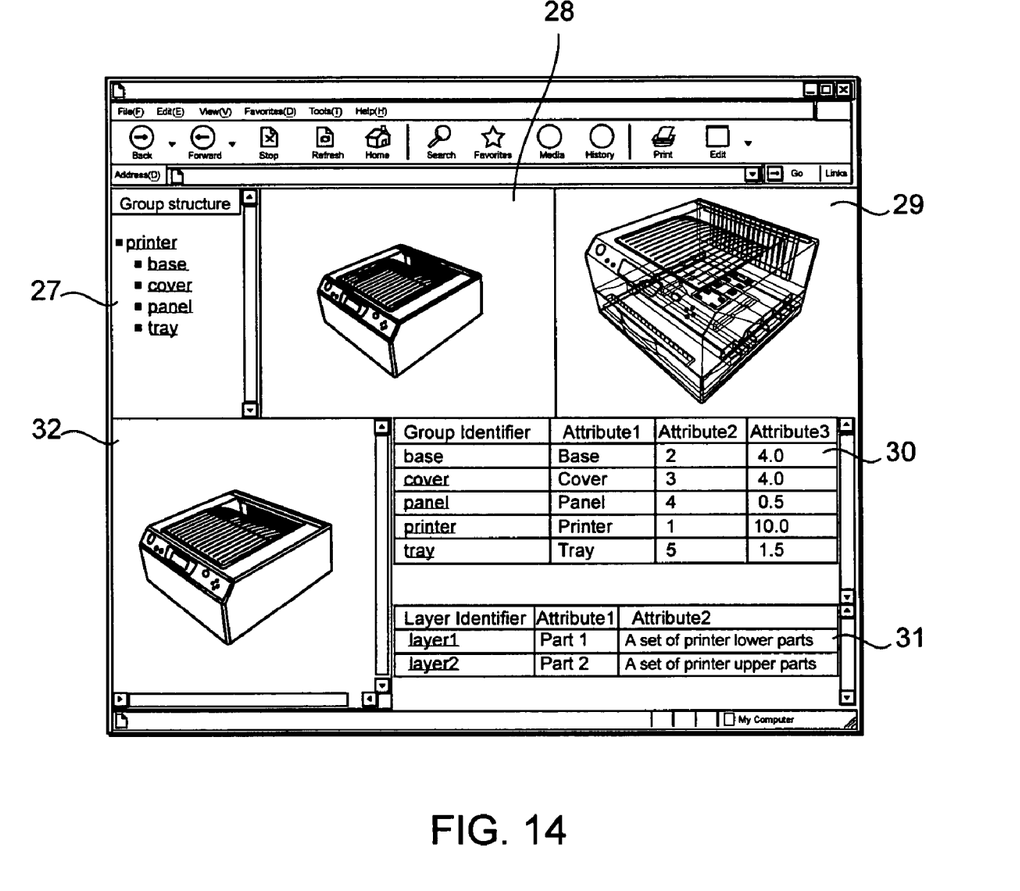
FIG. 14 is an example of a screen display for explaining linkage control.

FIG. 14 shows the status of this display. In this figure, 27 is a group structure, 28 is three-dimensional shape data, 29 is two-dimensional vector data, 30 is a group attribute table, 31 is a layer attribute table and 32 is image data.

"A linked processing" is executed (Step S9) when a user specifies a specific element using a mouse 34 or keyboard 35 shown in FIG. 1 for the information displayed above. That is, the specification from the input device is received by the "information processing module" that is in charge of the respective element. If this is an information processing module A, this information processing module A acquires the linkage identifier corresponding to the specified element and notifies its contents to the linkage control module 23. The linkage control module 23 notifies the identifier received to all other information processing modules B to C.

Each information processing modules B to C specifies the elements corresponding to the identifier received and displays the contents on the above display 25 (Step S10). In this case, the display method varies with the kinds of information that each "information processing module" controls and the contents of the linkage identifier that has been notified. For example, in the case of Attribute Tables 30 and 31, the corresponding portions are indicated by colors that are different from the usual colors, and in the case of image data 32, the contents of the display are replaced.

Figure 15:
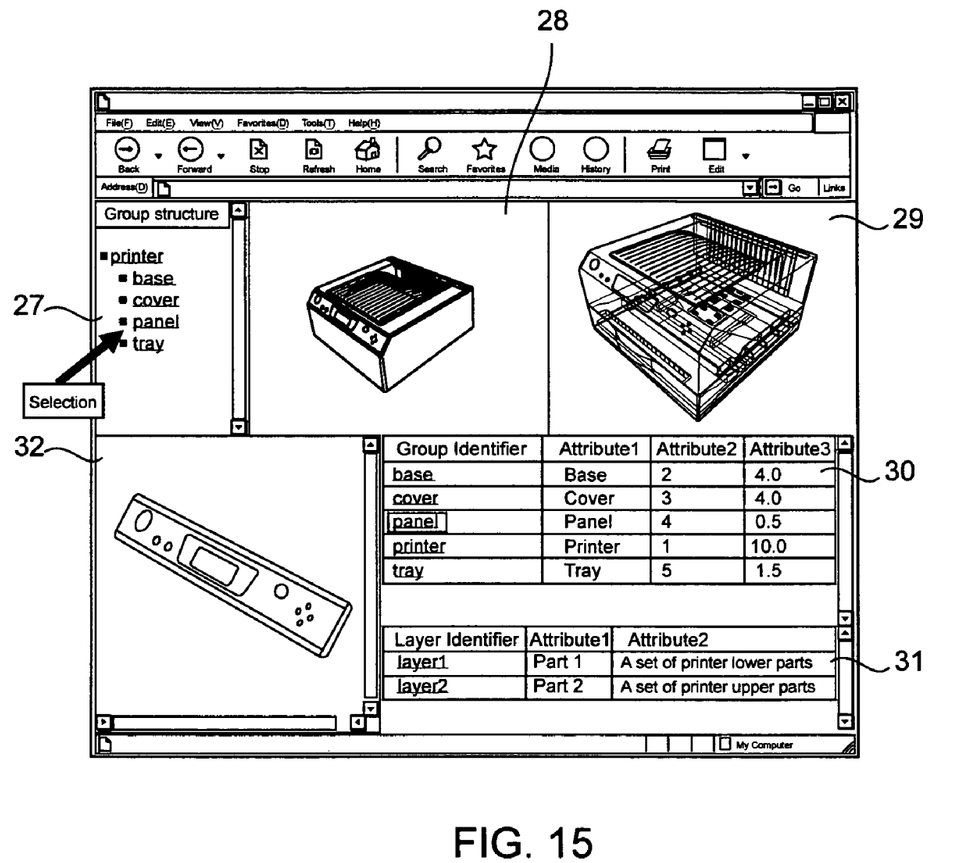
FIG. 15 is an example of a screen display for explaining linkage control.

For example, as shown in FIG. 15, when selecting "panel" in the display screen of the group structure 27, the corresponding portions in the three-dimensional shape data 28 and in the two-dimensional vector data 29 are indicated by red, a corresponding image data is displayed in the image data 32, and a corresponding row in the group Attribute Table 30 is indicated in yellow. In the layer attribute Table 31, no changes are made in the contents displayed since there is no corresponding element.

Figure 16:
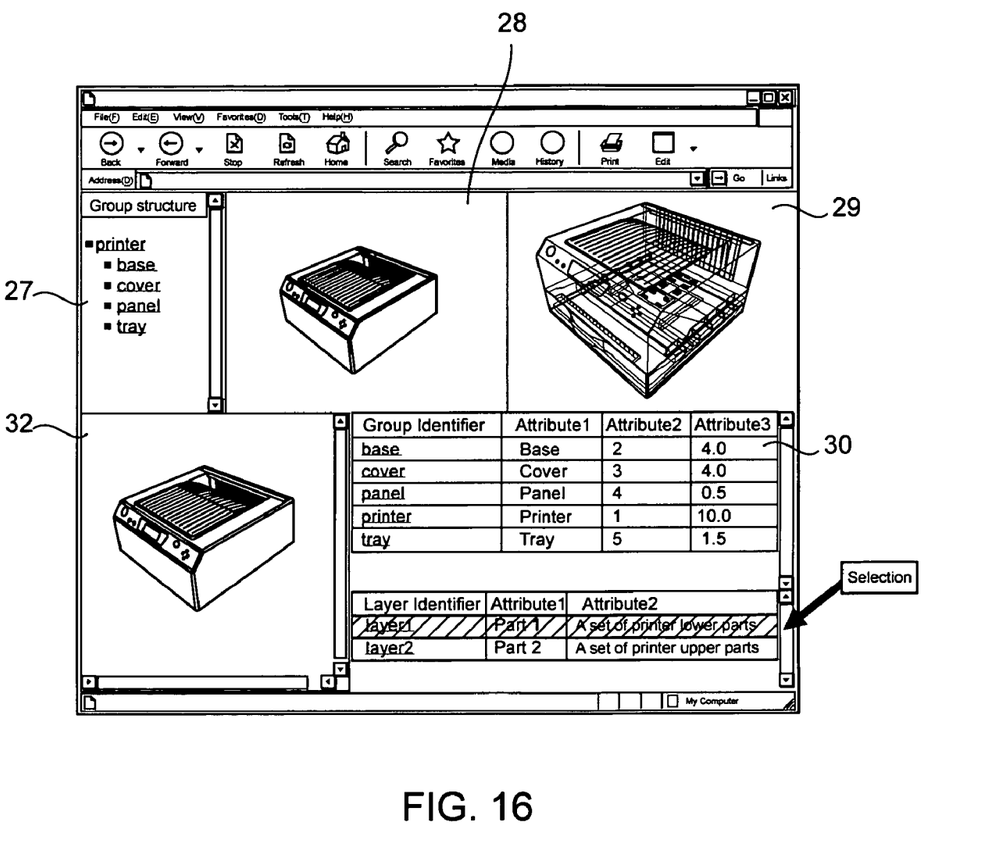
FIG. 16 is an example of a screen display for explaining linkage control.

FIG. 16 shows the results when selecting the layer of "layer 1" in the layer attribute Table 31. In this case, the row corresponding to the groups included in the layer is indicated in blue in the group structure 27 and in the group attribute Table 30. Only the portion corresponding to the groups included in the layer is indicated in blue in the three-dimensional shape data 28, and only the portion corresponding to the groups included in the layer is indicated in blue in the two-dimensional vector data 29. In this case, since an image corresponding to the layer is not prepared, there are no changes in the contents of image data 32.

According to this configuration, the scope of utilization of the shape information concerning a plurality of different kinds of shape elements included in three-dimensional shape data can be expanded.

In other words, traditionally the users must acquire the information individually and if linkages are necessary, the users must process them by directly editing while considering the contents of the information, which limits users from efficiently using the information included in the three-dimensional shape data.

However, according to the present invention, when generating shape information from three-dimensional shape data, linkage identifiers are added to the shape information so that linked processing can be carried out across the corresponding shape information of different shape elements. As a result, when processing of a single shape information is carried out, other shape information can be edited by linkage. Therefore, it becomes possible to handle a large volume of shape information, and consequently, its scope of usage is expanded.

The present invention is not limited by the above embodiment and a variety of modifications are possible within the scope of the fundamental of the present invention.

What is claimed is:

1. A system for acquiring shape information from three-dimensional shape data using a computer system, said three-dimensional shape data including at least one shape element, comprising:
a three-dimensional shape data acquisition unit for acquiring the three-dimensional shape data stored in a data storage unit;
a three-dimensional shape information generation unit for generating, at least two types of shape information related to each shape element based on parameters entered by a user;
a linkage identifier setup unit for adding one common linkage identifier for linking, said at least two types of shape information per shape element, when generating the shape information;
a shape information storing unit for storing said shape information having said linkage identifier in the data storage unit; and
a shape information linkage control unit for, while referring to said linkage identifier, linking and processing said at least two types of shape information related to a particular shape element selected by the user, wherein the linkage identifier for the shape element is sent and received.

2. The system of claim 1, wherein
said three-dimensional shape information generation unit successively acquires, based on the physical and logical organizations of said three-dimensional shape data, each type of shape information related to said shape elements making up such physical and logical organizations.

3. The system of claim 1, wherein
said three-dimensional shape information generation unit acquires, on said shape element basis, information regarding the shape element's name, attributes, two-dimensional vector data, and image data as said shape information.

4. The system of claim 1, wherein said linkage identifier setup unit generates linkage identifiers based on information concerning said shape elements included in said three-dimensional shape data.

5. The system of claim 1, wherein
said shape information linkage control unit comprises a plurality of information processing modules for displaying said shape information, and a linkage control module connected to said plurality of information processing modules, wherein upon the indication of a specific shape element related to the shape information displayed by said information processing modules, the linkage identifier corresponding to that shape element is sent to said linkage control module, and in turn, said linkage control module sends said identifier to each information processing module so that each information processing module changes, by a specified method, its display for the shape elements that correspond to said identifier.

6. The system according to claim 1 wherein the three-dimensional shape data comprises:
a shell for expressing the actual object of a shape, including geometric and topological information;
a group for expressing the structure of a shape, including a name of a part, positional information, and attribute information;
a layer for logical summing up elements included in a shape, including the name of the layer and attribute information; and
attribute information for setting elements of the group or layer, said attribute information comprising numerical values or character strings.

7. The system of claim 6 wherein all the groups within the shape data is expressed by groups having hierarchical structures, and the group comprises an end group in a hierarchical structure containing at least one shell.

8. The system of claim 7 wherein the layer is defined independently from the physical structure which expresses the actual object of the shape.

9. The system of claim 6 wherein the shape information generation unit is capable of acquiring an attribute table for group information containing linkage identifier and attribute information.

10. The system of claim 9, wherein the attribute table is configured to summarize information of the numerical values or character strings established in groups.

11. The system of claim 6 wherein the shape information generation unit is capable of acquiring an attribute table for providing layer information containing linkage identifier and attribute information.

12. The system of claim 11, wherein the attribute table is configured to summarize information of the numerical values or character strings established in layers.

13. The system of claim 1, wherein said shape information linkage control unit comprises:
a corresponding shape information processing module for each of the at least two types of shape information for specifying the shape element corresponding to the linkage identifier, and displaying the shape information of the shape element on a display system;
said shape information linkage control unit is for receiving the linkage identifier from the shape information processing module corresponding to one of the at least two types of the shape information and sending the linkage identifier to the shape information processing module corresponding to the other type of the at least two types of the shape information.

14. The system of claim 1 wherein the three-dimensional shape data acquisition unit is configured to acquire data in the XVL format.

15. A system for acquiring shape information from three-dimensional shape data using a computer system, said three-dimensional shape data including at least one shape element, and linking and processing at least two types of shape information related to said at least one shape element; said system comprising:
a three-dimensional shape data acquisition unit for acquiring the three-dimensional shape data stored in a data storage unit;
a three-dimensional shape information generation unit for generating, the at least two types of shape information related to each shape element based on parameters entered by a user;

a linkage identifier setup unit for adding one common linkage identifier for linking said at least two types of shape information per shape element, when generating the shape information; and a shape information storing unit for storing said shape information having said linkage identifier in the data storage unit.

16. A computer software program for acquiring shape information from three-dimensional shape data using a computer system, said three-dimensional shape data including at least one shape element, comprising:

a three-dimensional shape data acquisition command unit, stored in a computer readable storage medium, for acquiring three-dimensional shape data stored in a data storage unit;

a three-dimensional shape information generation command unit, stored in said computer-readable storage medium, for generating at least two types of shape information related to each of said at least one shape element based on parameters entered by a user;

a linkage identifier setup command unit, stored in said computer-readable storage medium, for adding one common linkage identifier for linking, said at least two types of shape information per shaped element, when generating the shape information;

a shape information storing command unit, stored in said computer-readable storage medium, for storing said shape information having said linkage identifiers in the data storage unit; and a shape information linkage control command unit, stored in said computer-readable storage medium, for linking and processing said at least two types of shape information related to a particular shape element selected by the user, wherein the linkage identifier for the shape element is sent and received.

17. A system for acquiring shape information from three-dimensional shape data using a computer system, said three-dimensional shape data including at least one shape element, comprising:

a three-dimensional shape data acquisition unit for acquiring the three-dimensional shape data stored in a data storage unit; wherein the shape data comprises:

a shell for expressing the actual object of a shape, including geometric and topological information;

a group for expressing the structure of a shape, including a name of a part, positional information, and attribute information;

a layer for logically summing up elements included in a shape, including the name of the layer and attribute information; and attribute information for setting elements of the group or layer, said attribute information comprising numerical values or character strings;

a three-dimensional shape information generation unit for generating shape information related to each shape element;

a linkage identifier setup unit for adding one common linkage identifier for linking shape information for each shape element when generating the shape information;

a shape information storing unit for storing said shape information having said linkage identifier in the data storage unit; and a shape information linkage control unit for, while referring to said linkage identifier linking and processing among the various types of shape information related to a particular shape element.

* * * * *